(12) United States Patent
Wang

(10) Patent No.: US 9,062,384 B2
(45) Date of Patent: Jun. 23, 2015

(54) CORROSION RESISTANT AND ELECTRICALLY CONDUCTIVE SURFACE OF METAL

(71) Applicant: TREADSTONE TECHNOLOGIES, INC., Princeton, NJ (US)

(72) Inventor: Conghua Wang, West Windsor, NJ (US)

(73) Assignee: TREADSTONE TECHNOLOGIES, INC., Princeton, NJ (US)

( * ) Notice: Subject to any disclaimer, the term of this patent is extended or adjusted under 35 U.S.C. 154(b) by 62 days.

(21) Appl. No.: 13/776,042

(22) Filed: Feb. 25, 2013

(65) Prior Publication Data

US 2013/0230793 A1 Sep. 5, 2013

Related U.S. Application Data

(60) Provisional application No. 61/602,253, filed on Feb. 23, 2012, provisional application No. 61/760,767, filed on Feb. 5, 2013.

(51) Int. Cl.

| | |
|---|---|
| *C25B 11/10* | (2006.01) |
| *H01M 4/86* | (2006.01) |
| *C25B 11/04* | (2006.01) |
| *C25B 13/04* | (2006.01) |
| *H01M 8/02* | (2006.01) |
| *H01M 4/36* | (2006.01) |
| *H01M 2/16* | (2006.01) |
| *C25D 11/26* | (2006.01) |
| *H01M 4/02* | (2006.01) |

(Continued)

(52) U.S. Cl.
CPC ............ *C25B 11/0478* (2013.01); *C25B 13/04* (2013.01); *H01M 4/8647* (2013.01); *H01M 8/0202* (2013.01); *H01M 4/36* (2013.01); *H01M 2/1686* (2013.01); *C25D 11/26* (2013.01); *H01M 4/02* (2013.01); *H01M 8/188* (2013.01); *H01M 8/0245* (2013.01); *C25D 11/022* (2013.01); *C23C 4/08* (2013.01); *C23C 4/18* (2013.01); *C23C 8/10* (2013.01); *C23C 28/321* (2013.01); *C23C 28/3455* (2013.01); *Y02E 60/50* (2013.01)

(58) Field of Classification Search
None
See application file for complete search history.

(56) References Cited

U.S. PATENT DOCUMENTS

| | | | |
|---|---|---|---|
| 4,223,049 | A | 9/1980 | Murray et al. |
| 4,255,247 | A | 3/1981 | Oda et al. |

(Continued)

FOREIGN PATENT DOCUMENTS

| | | |
|---|---|---|
| CN | 101667647 | 3/2010 |
| CN | 101748427 | 6/2010 |

(Continued)

OTHER PUBLICATIONS

International Search report issued in International Application No. PCT/US2013/027630, dated May 23, 2013.

(Continued)

*Primary Examiner* — Patrick Ryan
*Assistant Examiner* — Wyatt McConnell
(74) *Attorney, Agent, or Firm* — DLA Piper LLP US

(57) ABSTRACT

Methods for coating a metal substrate or a metal alloy with electrically conductive titania-based material. The methods produce metal components for electrochemical devices that need high electrical conductance, corrosion resistance and electrode reaction activities for long term operation at a low cost.

20 Claims, 4 Drawing Sheets

(51) Int. Cl.
  *C25D 11/02*     (2006.01)
  *C23C 4/08*      (2006.01)
  *C23C 4/18*      (2006.01)
  *C23C 8/10*      (2006.01)
  *C23C 28/00*     (2006.01)
  *H01M 8/18*      (2006.01)

(56) References Cited

U.S. PATENT DOCUMENTS

| | | |
|---|---|---|
| 4,411,762 A | 10/1983 | Kline |
| 4,443,317 A | 4/1984 | Kawashima et al. |
| 4,457,822 A | 7/1984 | Asano et al. |
| 4,468,416 A | 8/1984 | Asano et al. |
| 4,581,117 A | 4/1986 | Asano et al. |
| 4,618,404 A | 10/1986 | Pellegri |
| 4,686,017 A | 8/1987 | Young |
| 5,143,746 A | 9/1992 | Inoue et al. |
| 5,202,152 A | 4/1993 | Giannelis et al. |
| 5,204,140 A | 4/1993 | Grosvenor et al. |
| 5,290,415 A | 3/1994 | Shimamune et al. |
| 5,294,319 A | 3/1994 | Kaczur et al. |
| 5,298,095 A | 3/1994 | Russo et al. |
| 5,364,513 A | 11/1994 | Sekhar et al. |
| 5,419,824 A | 5/1995 | Weres et al. |
| 5,521,029 A * | 5/1996 | Fiorino et al. ............... 205/150 |
| 5,531,875 A | 7/1996 | Shimamune et al. |
| 5,962,904 A | 10/1999 | Hu |
| 6,060,229 A | 5/2000 | Eichorst et al. |
| 6,071,570 A | 6/2000 | Hardee et al. |
| 6,121,134 A | 9/2000 | Burton et al. |
| 6,231,731 B1 | 5/2001 | Kondo et al. |
| 6,270,831 B2 | 8/2001 | Kumar et al. |
| 6,455,107 B1 | 9/2002 | Sekhar et al. |
| 6,527,924 B1 | 3/2003 | Andolfatto et al. |
| 6,761,808 B1 | 7/2004 | Revill et al. |
| 7,077,895 B2 | 7/2006 | Akui et al. |
| 7,258,778 B2 | 8/2007 | Hardee |
| 7,294,248 B2 | 11/2007 | Gao |
| 7,318,974 B2 | 1/2008 | Ohara et al. |
| 7,422,671 B2 | 9/2008 | Bhatia et al. |
| 7,592,037 B2 | 9/2009 | Uchiyama et al. |
| 7,722,989 B2 | 5/2010 | Ohzuku et al. |
| 7,736,772 B2 | 6/2010 | Sarkar et al. |
| 7,901,742 B2 | 3/2011 | Shirono et al. |
| 8,007,643 B2 | 8/2011 | Faita et al. |
| 8,043,692 B2 | 10/2011 | Zhuk et al. |
| 8,173,320 B2 | 5/2012 | Takata et al. |
| 8,349,248 B2 | 1/2013 | Trotzschel et al. |
| 2002/0018105 A1* | 2/2002 | Usui et al. ..................... 347/70 |
| 2002/0192527 A1 | 12/2002 | Seido et al. |
| 2003/0151032 A1 | 8/2003 | Ito et al. |
| 2003/0170980 A1 | 9/2003 | Moriya et al. |
| 2003/0232136 A1 | 12/2003 | Fukuda et al. |
| 2004/0003993 A1 | 1/2004 | Weres et al. |
| 2004/0038111 A1 | 2/2004 | Eddy et al. |
| 2004/0053049 A1 | 3/2004 | Tsunashima et al. |
| 2004/0110058 A1 | 6/2004 | Lee et al. |
| 2004/0151952 A1 | 8/2004 | Brady et al. |
| 2004/0168927 A1 | 9/2004 | Matsushita |
| 2004/0176828 A1 | 9/2004 | O'Brien |
| 2004/0188247 A1 | 9/2004 | Hardee |
| 2004/0203221 A1 | 10/2004 | Matsuda et al. |
| 2004/0226817 A1 | 11/2004 | Hosonuma |
| 2004/0241490 A1 | 12/2004 | Finley |
| 2004/0244648 A1 | 12/2004 | Akui et al. |
| 2004/0247978 A1* | 12/2004 | Shimamune ................ 429/34 |
| 2005/0191504 A1 | 9/2005 | Brady |
| 2005/0205165 A1 | 9/2005 | Akui et al. |
| 2005/0221158 A1 | 10/2005 | Yamauchi et al. |
| 2006/0134501 A1 | 6/2006 | Lee et al. |
| 2006/0188775 A1 | 8/2006 | Mance et al. |
| 2006/0251800 A1 | 11/2006 | Weidman et al. |
| 2006/0278123 A1 | 12/2006 | Wirth |
| 2006/0289057 A1 | 12/2006 | Gonda et al. |
| 2007/0031694 A1 | 2/2007 | Hosonuma et al. |
| 2007/0034505 A1 | 2/2007 | Ikematsu et al. |
| 2007/0066053 A1 | 3/2007 | Furuya |
| 2007/0202361 A1 | 8/2007 | Frauchiger et al. |
| 2007/0264821 A1 | 11/2007 | Kim et al. |
| 2008/0076004 A1 | 3/2008 | Rodak et al. |
| 2008/0115810 A1 | 5/2008 | Kato |
| 2008/0245661 A1 | 10/2008 | Beckmann et al. |
| 2009/0017318 A1 | 1/2009 | Ruuttu et al. |
| 2009/0061210 A1 | 3/2009 | Ruuttu et al. |
| 2009/0061272 A1 | 3/2009 | Blennow et al. |
| 2009/0126787 A1 | 5/2009 | Ruuttu et al. |
| 2009/0136739 A1 | 5/2009 | Ruuttu et al. |
| 2009/0166812 A1 | 7/2009 | Ruuttu et al. |
| 2009/0176120 A1 | 7/2009 | Wang |
| 2009/0200162 A1 | 8/2009 | Faita et al. |
| 2009/0202736 A1 | 8/2009 | Horie et al. |
| 2009/0211667 A1 | 8/2009 | Suzuki et al. |
| 2009/0214926 A1 | 8/2009 | Watanabe et al. |
| 2009/0214927 A1 | 8/2009 | Dadheech et al. |
| 2009/0218228 A1 | 9/2009 | Inbe et al. |
| 2009/0242417 A1 | 10/2009 | Cao et al. |
| 2009/0253025 A1 | 10/2009 | Whitacre |
| 2009/0269649 A1 | 10/2009 | Jeon et al. |
| 2009/0297918 A1 | 12/2009 | Sasaoka et al. |
| 2010/0025253 A1 | 2/2010 | Yoshioka et al. |
| 2010/0071810 A1 | 3/2010 | Nadaud et al. |
| 2010/0084259 A1 | 4/2010 | Kato et al. |
| 2010/0132786 A1 | 6/2010 | Inoue et al. |
| 2010/0136366 A1 | 6/2010 | Sasaoka |
| 2010/0221489 A1 | 9/2010 | Lappalainen et al. |
| 2010/0233587 A1 | 9/2010 | Sato et al. |
| 2010/0260928 A1 | 10/2010 | Hasegawa et al. |
| 2010/0261034 A1 | 10/2010 | Cardarelli |
| 2010/0291467 A1 | 11/2010 | Ji et al. |
| 2010/0310969 A1 | 12/2010 | Maeda et al. |
| 2010/0311289 A1 | 12/2010 | Sullivan et al. |
| 2011/0001153 A1 | 1/2011 | Tchakarov et al. |
| 2011/0048525 A1 | 3/2011 | Yoneya et al. |
| 2011/0065024 A1 | 3/2011 | Jeon et al. |
| 2011/0168253 A1 | 7/2011 | Yamada et al. |
| 2011/0192458 A1 | 8/2011 | Doi et al. |
| 2011/0232743 A1 | 9/2011 | Yamaguchi et al. |
| 2011/0262757 A1 | 10/2011 | Lu et al. |
| 2011/0311732 A1 | 12/2011 | Bignon et al. |
| 2011/0318600 A1 | 12/2011 | Matsunaga et al. |
| 2012/0004254 A1 | 1/2012 | Pei et al. |
| 2012/0017979 A1 | 1/2012 | Igarashi et al. |
| 2012/0031483 A1 | 2/2012 | Obana et al. |
| 2012/0085571 A1 | 4/2012 | Niksa et al. |
| 2012/0086793 A1 | 4/2012 | Anabuki |
| 2012/0094075 A1 | 4/2012 | Peter et al. |
| 2012/0094215 A1 | 4/2012 | Satou et al. |
| 2012/0103828 A1 | 5/2012 | Bulan et al. |
| 2012/0125785 A1 | 5/2012 | Gull et al. |
| 2012/0171468 A1 | 7/2012 | Tanaka et al. |
| 2012/0211048 A1 | 8/2012 | Murofushi et al. |
| 2012/0222963 A1 | 9/2012 | Ishida et al. |
| 2012/0295184 A1 | 11/2012 | Watanabe et al. |
| 2013/0056360 A1* | 3/2013 | Lu et al. ........................ 205/96 |

FOREIGN PATENT DOCUMENTS

| | | |
|---|---|---|
| CN | 101853945 | 10/2010 |
| CN | 202094217 | 12/2011 |
| DE | 34 32 652 | 3/1986 |
| EP | 0 845 281 | 6/1998 |
| EP | 1 449 891 | 8/2004 |
| JP | 11-273693 | 10/1999 |
| JP | 2005-005137 | 1/2005 |
| JP | 2005-174572 | 6/2005 |
| JP | 2005/293862 | 10/2005 |
| JP | 2008-121087 | 5/2008 |
| JP | 2009-102676 | 5/2009 |
| KR | 2001-0040354 | 5/2001 |
| RU | 2330124 | 7/2008 |
| RU | 2419686 | 5/2011 |
| WO | WO 94/17224 | 8/1994 |
| WO | WO 96/37005 | 11/1996 |

(56) References Cited

FOREIGN PATENT DOCUMENTS

| WO | WO 97/27344 | | 7/1997 |
|---|---|---|---|
| WO | WO 99/36193 | | 7/1999 |
| WO | WO 03/067683 | | 8/2003 |
| WO | WO 2007/096485 | | 8/2007 |
| WO | WO 2009/118991 | | 10/2009 |
| WO | WO2010/007918 | * | 1/2010 |

OTHER PUBLICATIONS

Written Opinion issued in International Application No. PCT/US2013/027630, dated May 23, 2013.
E.E. Averiyanov, Spravochnik po anodirovaniyu, Moskva, Mashinostroenie, pp. 82-83 (1988).
English language abstract of RU 2419686, published May 27, 2011.
English language abstract of RU 2330124, published Jul. 28, 2008.
English language abstract of CN 101853945, published Oct. 6, 2010.
English language abstract of CN 202094217, published Aug. 28, 1984.
English language abstract of JP 11-273693, published Oct. 8, 1999.
Machine English language translation of JP 11-273693, published Oct. 8, 1999.
English language abstract of JP 2009-102676, published May 14, 2009.
Machine English language translation of JP 2009-102676, published May 14, 2009.
English language abstract of JP 2005-005137, published Jan. 6, 2005.
Machine English language translation of JP 2005-005137, published Jan. 6, 2005.
English language abstract of JP 2005-293862, published Oct. 20, 2005.
Machine English language translation of JP 2005-293862, published Oct. 20, 2005.
English language abstract of DE 34 32 652, published Mar. 13, 1986.
English language abstract JP 2005-174572, published Jun. 30, 2005.
Machine English language translation of JP 2005-174572, published Jun. 30, 2005.
English language abstract of CN 101748427, published Jun. 23, 2010.
English language abstract of CN 101667647, published Mar. 10, 2010.
English language abstract of JP 2008-121087, published May 29, 2008.
Machine English language translation of JP 2008-121087, published May 29, 2008.

\* cited by examiner

CORROSION RESISTANT AND ELECTRICALLY CONDUCTIVE SURFACE OF METAL

CROSS REFERENCE TO RELATED APPLICATIONS

This application claims priority from U.S. Provisional Application Ser. No. 61/602,253 filed Feb. 23, 2012 and U.S. Provisional Application Ser. No. 61/760,767 filed on Feb. 5, 2013, the entireties of which are incorporated herein by reference.

FIELD OF THE INVENTION

Embodiments of the invention relate to the enhancement of metal surface electrical conductivity, corrosion resistance and the electrode reaction activity for electrochemical applications. More specifically, the embodiments disclosed herein relate to the use of titanium alloys and an electrically conductive titanium oxide to modify a metal surface for electrochemical applications that typically need the high corrosion resistant and electrically conductive surface of metallic components.

BACKGROUND

Metallic materials are widely used in various electrochemical devices, including the electrode in a chlor-alkali process and the separator plates in fuel cells. Metal components are also used in batteries, electrolyzers and electrochemical gas separation devices. In most of these applications, the surface of the metal components need to have high electrical conductance (or low electrical resistance) to reduce the internal electrical losses of the electrochemical devices, or high activity for electrode reactions to reduce electrode polarization, for high operation efficiency. The major challenge for this application is that the metal component must also have high corrosion resistance while maintaining its high electrical conductance. In applications using metal as an electrode, the metal surface should have high catalytic activity for a highly efficient electrode reaction.

U.S. Pat. No. 6,649,031 discloses fuel cell metal bipolar plates that are coated with a corrosion resistant and electrically conductive carbon layer that with a sub-layer between the metal substrate and coating layer. In order to further improve the corrosion resistance, the coating layer is treated with an overcoating sealing that seals off the pores in the carbon layer.

U.S. Pat. No. 6,689,213 discloses a fuel cell metal bipolar plate that has a multi-phase surface coating. One phase is metal, and the other phase is a compound phase that consists of metal nitride, oxide, carbide or boride.

US Patent application publication no. 2006/0134501 discloses a fuel cell metal separator plate that has an electrically conductive, corrosion resistant surface layer on a metal substrate. The surface layer comprises metal carbides, metal borides, and metal oxides. There is a metal layer between the surface layer and the metal substrate to improve the adhesion of the surface layer and the metal substrate. It has Cr-rich surface passive film.

US Patent application publication no. 2009/0269649 discloses a fuel cell stainless steel separator plate that has an electrically conductive and corrosion resistant surface layer that comprises metal nitride, carbide and metal boride. The surface layer is deposited on the surface modified stainless steel.

US Patent application publication no. 2008/0107928 discloses a fuel cell bipolar plate that has a gold (Au) or platinum (Pt) surface layer and an oxygen containing interface layer.

US Patent application publication no. 2009/0015029 discloses fuel cell bipolar plates that are coated with an electrically conductive layer. The conductive layer could be carbon, molybdenum doped indium oxide, chromium nitride or an $MoSi_2$ layer. The '029 publication does not specifically disclose an underlayer between the conductive coating layer and the substrate layer.

US Patent application publication no. 2007/0003813 discloses using conductive oxide including doped $TiO_2$ as a surface coating layer in fuel cells. The deposition process includes physical vapor deposition.

There remains a need for a method that produces metal components for electrochemical devices that need high electrical conductance, corrosion resistance and electrode reaction activities for long term operation at a low cost.

DETAILED DESCRIPTION

Figure 1:
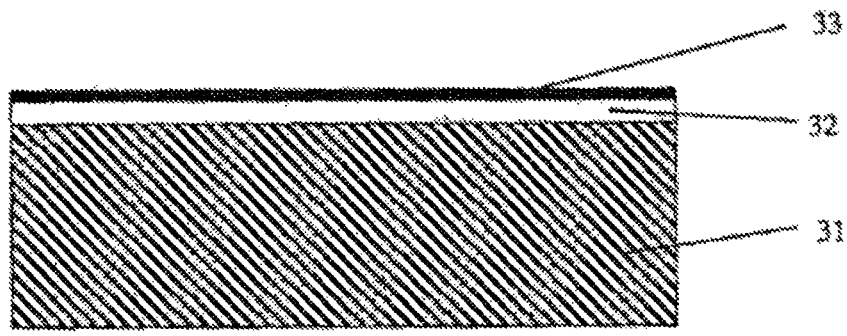
FIG. 1 is the schematic drawing of the metal plates with electrically conductive titania grown on the Ti alloy continue layer that is deposited on the metal plate surface.

In the following detailed description, a plurality of specific details, such as types of materials and dimensions, are set forth in order to provide a thorough understanding of the preferred embodiments discussed below. The details discussed in connection with the preferred embodiments should not be understood to limit the present inventions. Furthermore, for ease of understanding, certain method steps are delineated as separate steps; however, these steps should not be construed as necessarily distinct nor order dependent in their performance.

An object of the embodiments disclosed herein is to provide a metal surface that has a titanium alloy layer deposited therein and that can grow an electrically conductive doped titanium oxide on the surface of the alloy. The possible applications of the disclosed embodiments include use in electrochemical devices, including fuel cells, batteries, electrolyzers, and gas separation devices. It should be appreciated that growing the doped titanium oxide is a much better technique as it provides better qualities (e.g., better adhesive qualities) than deposition methods.

An advantage of the disclosed methods are that they can produce metal components for electrochemical devices that need high electrical conductance, corrosion resistance and electrode reaction activities for long term operation at a low cost. As is explained below, these devices include fuel cells, batteries, electrolyzers and gas separation devices.

Regular titanium oxide (titania) is an electrical insulator in the form of $TiO_2$ in which titanium is in the valence status of $Ti^{+4}$. Through certain processes, some $Ti^{+4}$ can be converted to lower chemical valences such as $Ti^{+3}$ and $Ti^{+2}$. The coexistence of multiple valance Ti in the oxide can make the titanium oxide an excellent electrical conductor (i.e., electrically conductive titania).

One way to convert $Ti^{+4}$ to lower chemical valences is to reduce $TiO_2$ at high temperature, and quench it to room temperature to "freeze" the $Ti^{+3}$ and $Ti^{+2}$. The final formulation of the reduced titanium oxide (i.e., reduced titania) is $TiO_x$, where x is less than 2.

A more reliable way is to dope high valence element oxides (e.g., $M_2O_5$ or $MO_3$) into $TiO_2$ to form a solid solution of the dopant oxide and $TiO_2$ (i.e., doped titania, $M:TiO_x$). The high valence of the dopant will stabilize low valence (+2 and +3) titanium in the titanium oxide crystal structure, which will make the doped titania electrically conductive. The common dopants are niobium (Nb) and tantalum (Ta).

It is known that directly depositing oxides on a metal surface has the risks of poor adhesion of the oxides to the metal surface. This problem is overcome in the embodiments disclosed herein by growing titanium oxide on a titanium alloy for better adhesion.

The embodiments disclosed herein use electrically conductive titania grown on a titanium alloy that is coated on a metal substrate surface to improve the surface electrical resistance, corrosion resistance and electrode reaction activity of the metal for electrochemical applications. The embodiments also form the doped titania on the surface of titanium alloys.

According to the disclosed principles, the titanium alloy could be deposited by various deposition techniques, including e.g., vapor deposition (physical or chemical) and thermal spray. Then, the electrically conductive titania could be grown on a titanium alloy surface. The titanium alloy has the proper concentration of the dopant elements as the alloy elements. The concentration is within the range of 1%-30%, preferably between %-10%. The titanium alloy can be deposited on a lower cost metal substrate surface. It can cover the entire substrate surface or a partial surface of the metal substrate.

The metal substrate could be corrosion resistive metal, such as titanium, niobium, zirconium, tantalum, chromium, nickel and their alloys, or low cost carbon steel, stainless steel, copper, aluminum and their alloys with a corrosion resistive surface treatment.

In one embodiment, the titanium alloy contains, among other things, high valence (e.g., greater than +4) elements, such as e.g., niobium (Nb), tantalum (Ta), vanadium (V), arsenic (As), selenium (Se), antimony (Sb), molybdenum (Mo), or tungsten (W). The doped titania layer can grow naturally on the alloy surface during its application. It can also grow through a special treatment step, such as thermal oxidization, anodizing and plasma oxidation.

A schematic drawing of a first embodiment is shown in FIG. 1. A titanium alloy 32 is coated on the entire surface of a metal substrate 31. The doped titania surface layer 33 is grown on the Ti alloy surface.

Figure 2:
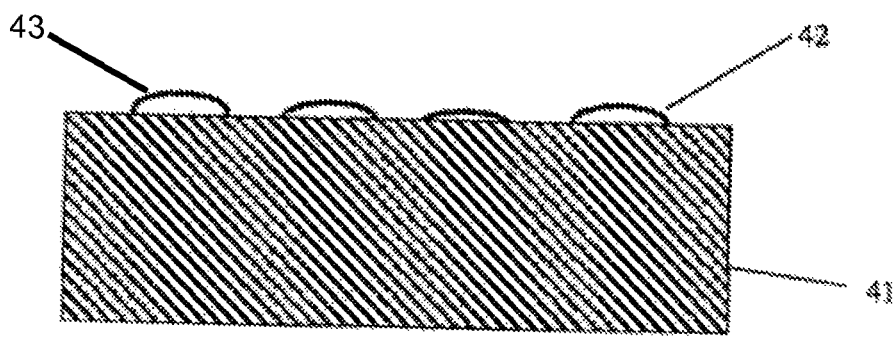
FIG. 2 is the schematic drawing of the metal plates with electrically conductive titania grown on the Ti alloy particles that are deposited on the metal plate surface.

In another embodiment, the titanium alloy is deposited to partially cover the metal substrate surface. Referring to FIG. 2, titanium alloy particles 42 are deposited on the surface of a metal substrate 41, only partially covering the surface. The doped titania surface layer 43 is grown on the Ti alloy particle surface.

It should be appreciated that the embodiments of FIGS. 1 and 2 are not limited to the specific features discussed above. For example, although not shown, to prevent contamination of the alloy from the substrate during processing and to improve adhesion of the alloy to the substrate, an interface layer can be provided on the substrate. Moreover, the growing conditions listed herein are mere examples and it should be appreciated that the growing can occur before the substrate is placed within the device or after. The exact process used (i.e., thermal oxidation, anodizing, plasma oxidation) will depend on the type of application or processing costs.

In one application, a niobium doped titania ($Nb:TiO_x$) layer is deposited on a stainless steel substrate surface by e.g., a physical vapor deposition process. The Nb concentration in the doped titania is 2-10%. The thickness of the Nb doped titania is 0.1 µm. This plate can be used as a separator plate for proton exchange membrane (PEM) fuel cells an example of which is shown in FIG. 3.

Figure 3:
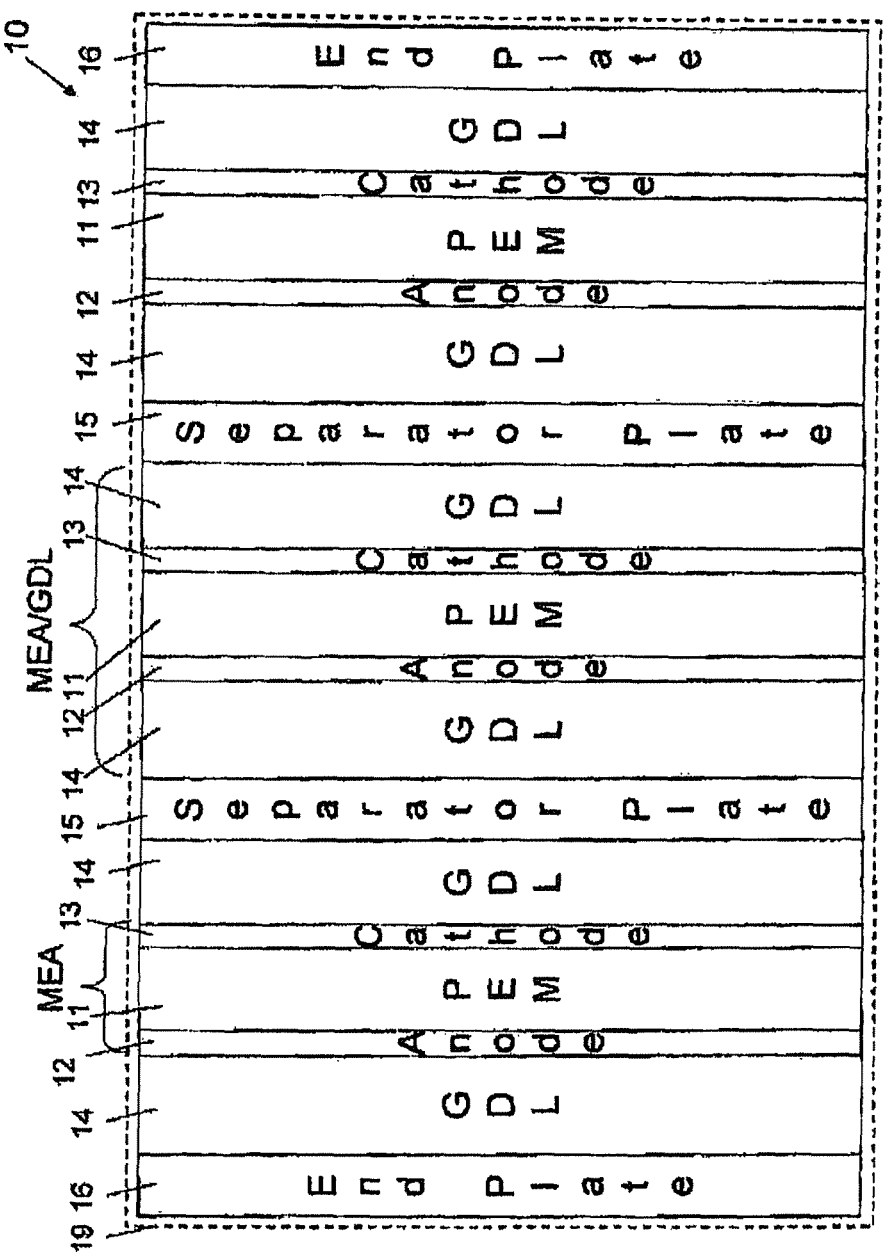
FIG. 3 is a schematic drawing of a bipolar fuel stack.

An example fuel cell stack 10 disposed in a container 19 is shown in FIG. 3. The fuel cell stack 10 includes three MEA (membrane electrode assembly)/GDLs (gas distribution layer), each comprising a proton exchange membrane (PEM) 11 with an anode 12 and a cathode 13 on opposite sides of the PEM 11 to form MEAs, and gas diffusion layers 14 adjacent the MEAs on opposite sides. Separator plates 15 are disposed between adjacent MEA/GDLs, and end plates 16 are present on opposite ends of the fuel stack 10 formed by the three MEA/GDLs. The separator plates 15 are referred to as bipolar separator plates as they have an anode 12 on one side and a cathode 13 on the other. Fuel cell stacks with monopolar separator plates in which the anode and cathode are swapped in adjoining MEAs are also known in the art as discussed above. Either of these types of fuel cell stacks may be combined with additional components (manifolds, etc., not shown) to form fuel cell devices as is well known in the art.

Figure 4:
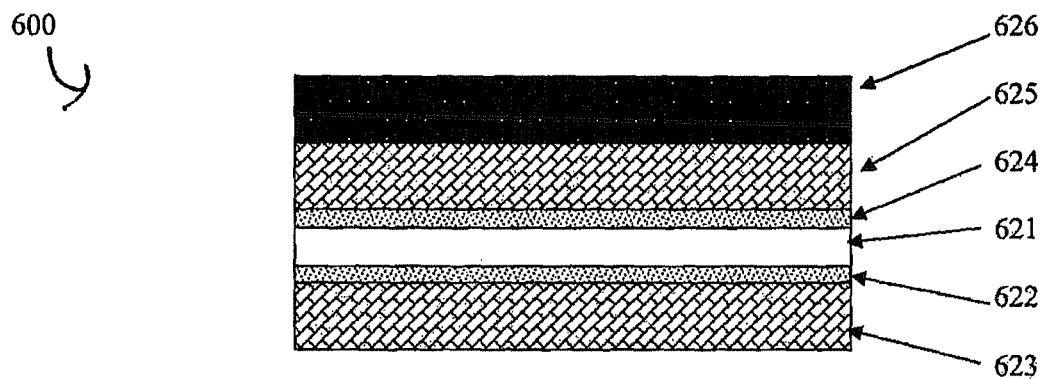
FIG. 4 is an example electrolyzer cell in which embodiments disclosed herein can be utilized.

In another application, a thin Ti15Nb alloy (e.g., 85% wt Ti, 15% wt Nb alloy) layer is deposited on a titanium substrate surface by e.g., a physical vapor deposition process. The thickness of the Ti15Nb layer is 0.5 µm. Then, the coated titanium substrate is thermally oxidized at 600° C. to obtain the stable Nb doped titania surface layer. This coated titanium substrate can be used as the components in water electrolyzer cells. Specifically, the coated titanium substrate could be used as a single piece bipolar plate and/or an oxygen gas diffusion layer in an electrolyzer cell, an example of which is shown in FIG. 4. FIG. 4 illustrates a simplified schematic diagram of a Proton Exchange Membrane (PEM) or an Alkaline Exchange Membrane (AEM) electrolyzer cell module, simply referred to as an electrolyzer cell module 600 hereinafter. The electrolyzer stack is constructed with a number of repeat cell modules 600, which includes electrolyte 621, the cathode catalyst 622 for hydrogen generation, hydrogen gas diffusion layer 623, anode catalyst 624 for oxygen generation, oxygen gas diffusion layer 625, and bipolar separate plate 626, the operation of which is well known in the art.

Figure 5:
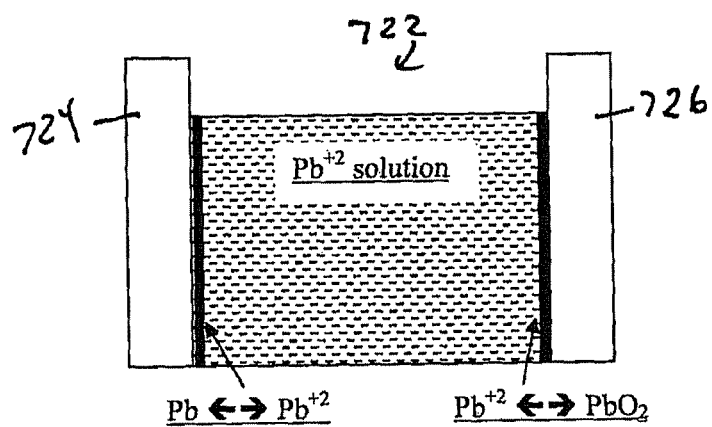
FIG. 5 is an example battery in which embodiments disclosed herein can be utilized.

In one further application, particles of Ti20Ta (e.g., 80% wt Ti, 20% wt Ta) alloy is deposited on a titanium substrate by thermal spray process. Then, the coated titanium substrate is thermally oxidized at 450° C. in air to obtain the Ta doped titania surface layer on the Ti20Ta alloy particles. This coated Ti plate can be used as the electrode of soluble lead acid flow batteries, such as the battery 722 shown in FIG. 5. The battery 722 includes a plurality of electrodes 724, 726 and several cell elements provided in separate compartments. The battery electrode active materials can be in all solid form and bonded on the electrode plate 724, 726 surface. In similar fashion, the doped titanium oxide particles could be used in a conventional lead acid battery.

Figure 6:
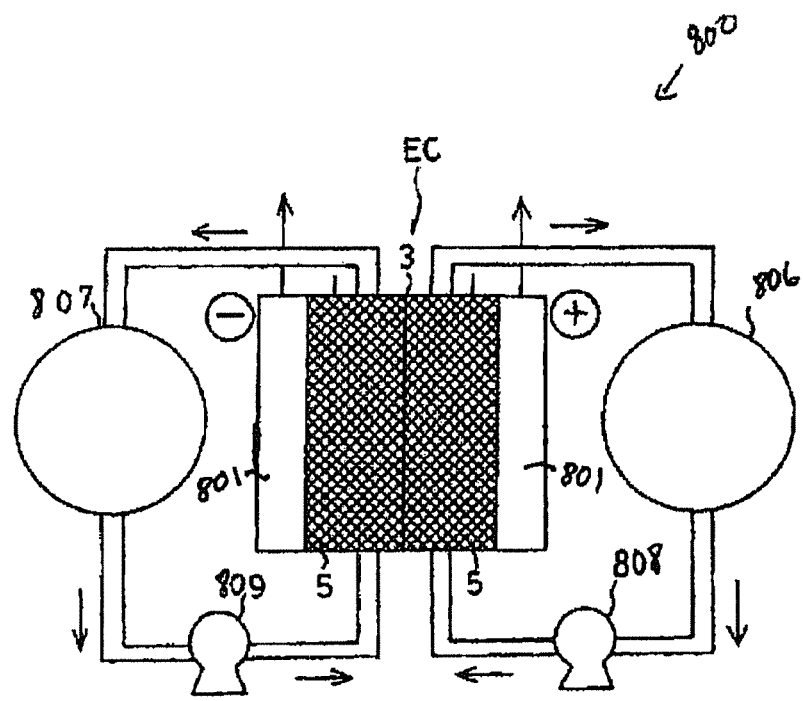
FIG. 6 is an example battery in which embodiments disclosed herein can be utilized.

In yet another application, a Ti20Nb alloy is used as a separate plate and/or an electrode for vanadium redox flow batteries. After the substrate is formed to the desired shape, it is anodized at a high voltage to grow a layer of e.g., Nb doped titania. Then, the Ti alloy substrate with the doped titania is heat treated at high temperature to form a better crystalized structure. The high surface area of the conductive titania will have the high electrode reaction activity needed for vanadium ion redox reactions in the vanadium redox flow battery, such as the example battery 800 shown in FIG. 6. The battery 800 comprises electrodes 801 and external tanks 806 and 807 for storing an electrolyte solution and an electrolytic cell EC, while pumps 808 and 809 are sending the electrolyte solution containing an active material from the external tanks 806 and 807 to the electrolytic cell EC. Electrodes 801 incorporated in the electrolytic cell EC perform electrochemical conversion (i.e. charge-discharge).

The typical flow battery is the all liquid flow battery that all reactants and products of the electrode reaction are liquid, can flow in and out of the cell EC. Another type is the semi-flow battery, the at least one electrode reaction is liquid to solid. This type of flow battery include Zr—Br battery (include zinc ion to zinc metal reaction), and all iron battery (include iron ion to iron metal reaction). The metal plate can be used as the electrode.

As mentioned above, it should be appreciated that embodiments disclosed herein are not limited to the specific features discussed above. For example, although not shown, in the embodiments of FIGS. 1 and 2, to prevent contamination of the alloy from the substrate during processing and to improve adhesion of the alloy to the substrate, an interface layer can be provided on the substrate. Moreover, the growing conditions listed herein are mere examples and it should be appreciated that the growing can occur before the substrate is placed within the device or after. The exact process used (i.e., thermal oxidation, anodizing, plasma oxidation) will depend on the type of application or processing costs. Moreover, the concentration of the dopants can be within the range of 1%-30%, preferably 1%-10%.

The foregoing examples are provided merely for the purpose of explanation and are in no way to be construed as limiting. While reference to various embodiments is made, the words used herein are words of description and illustration, rather than words of limitation. Further, although reference to particular means, materials, and embodiments are shown, there is no limitation to the particulars disclosed herein. Rather, the embodiments extend to all functionally equivalent structures, methods, and uses, such as are within the scope of the appended claims.

Additionally, the purpose of the Abstract is to enable the patent office and the public generally, and especially the scientists, engineers and practitioners in the art who are not familiar with patent or legal terms or phraseology, to determine quickly from a cursory inspection the nature of the technical disclosure of the application. The Abstract is not intended to be limiting as to the scope of the present inventions in any way.

What is claimed is:

1. A method of coating a surface of a metal substrate, said method comprising:
   providing the metal substrate;
   depositing a titanium alloy on the surface of the metal substrate; and
   growing a doped titania material on a first surface of the titanium alloy,
   wherein the titanium alloy is deposited on less than an entire area of the metal substrate.

2. The method of claim 1, wherein the titanium alloy contains elements having a valence greater than +4.

3. The method of claim 2, wherein the elements having a valence greater than +4 comprise at least one of niobium, tantalum, vanadium, arsenic, selenium, antimony, molybdenum or tungsten, and a concentration of the elements having a valence greater than +4 are in the range of 1%-30%.

4. The method of claim 1, wherein the doped titania material is grown using a thermal oxidation process.

5. The method of claim 1, wherein the doped titania material is grown using an anodizing process.

6. The method of claim 1, wherein the doped titania material is grown using a plasma oxidization.

7. The method of claim 1, further comprising an interface layer on the metal substrate.

8. An electrochemical device comprising:
   a metal component having a first surface;
   a titanium alloy on the first surface of the metal component; and
   a doped titania material grown on a first surface of the titanium alloy,
   wherein the titanium alloy is deposited on less than an entire area of the first surface of the metal component.

9. The device of claim 8, wherein the titanium alloy contains elements having a valence greater than +4.

10. The device of claim 9, wherein the elements having a valence greater than +4 comprise at least one of niobium, tantalum, vanadium, arsenic, selenium, antimony, molybdenum or tungsten, and a concentration of the elements having a valence greater than +4 are in the range of 1-30%.

11. The device of claim 8, wherein the doped titania material is grown on the metal component before the component is installed into the device.

12. The device of claim 8, wherein the doped titania material is grown on the metal component after the component is installed into the device.

13. The device of claim 8, wherein the device is an electrolyzer cell and the metal component is separator plate or gas diffusion layer.

14. The device of claim 8, wherein the device is a lead acid flow battery and the component is an electrode of the battery.

15. The device of claim 8, wherein the device is a flow battery and the metal component is a separator plate or an electrode of the battery.

16. The device of claim 8, wherein the device is a proton exchange membrane fuel cell and the metal component is a separator plate of the fuel cell.

17. A plate for a fuel cell, said plate comprising:
   a metal substrate having a first surface;
   a titanium alloy deposited on the first surface of the substrate; and
   a doped titania material grown on the titanium alloy,
   wherein the titanium alloy is deposited as particles on a less than an entire area of the first surface.

18. The plate of claim 17, wherein said titanium alloy comprises at least one of tantalum or niobium.

19. The plate of claim 17, wherein the titanium alloy has a thickness of approximately 0.1 nm to 100 µm.

20. The plate of claim 17, wherein the titanium alloy has a thickness of approximately 0.5 µm to 5 µm.

* * * * *